United States Patent
Lee et al.

(10) Patent No.: US 10,287,681 B2
(45) Date of Patent: May 14, 2019

(54) COPPER METAL FILM, METHOD FOR PREPARING THE SAME, AND METHOD FOR FORMING COPPER INTERCONNECT FOR SEMICONDUCTOR DEVICE USING THE SAME

(71) Applicant: UP CHEMICAL CO., LTD., Pyeongtaek-si (KR)

(72) Inventors: Won-Jun Lee, Seoul (KR); Jae-Min Park, Seoul (KR)

(73) Assignee: UP Chemical Co., Ltd., Pyeongtaek-si (KR)

( * ) Notice: Subject to any disclaimer, the term of this patent is extended or adjusted under 35 U.S.C. 154(b) by 396 days.

(21) Appl. No.: 15/191,848

(22) Filed: Jun. 24, 2016

(65) Prior Publication Data

US 2016/0305024 A1    Oct. 20, 2016

Related U.S. Application Data

(63) Continuation of application No. PCT/KR2014/012816, filed on Dec. 24, 2014.

(30) Foreign Application Priority Data

Dec. 24, 2013 (KR) .................. 10-2013-0162718

(51) Int. Cl.
  *C23C 16/34* (2006.01)
  *C23C 16/56* (2006.01)
  (Continued)

(52) U.S. Cl.
  CPC ........ *C23C 16/45553* (2013.01); *C23C 16/34* (2013.01); *C23C 16/56* (2013.01); *C23C 18/1204* (2013.01); *C23C 18/1279* (2013.01);
  *C23C 18/1295* (2013.01); *H01L 21/28556* (2013.01); *H01L 21/76862* (2013.01); *H01L 21/76864* (2013.01); *H01L 21/76873* (2013.01); *H01L 23/53228* (2013.01);
  (Continued)

(58) Field of Classification Search
  None
  See application file for complete search history.

(56) References Cited

U.S. PATENT DOCUMENTS 6,492,268 B1    12/2002    Pyo

FOREIGN PATENT DOCUMENTS

KR          10-0338112 B1      5/2002
KR      10-2004-0003386 A      1/2004
(Continued)

OTHER PUBLICATIONS

Park, Jae-Min & Jin, Kwangseon & Han, Byeol & Jun Kim, Myung & Jung, Jongwan & Jeong Kim, Jae & Lee, Won-Jun. (2014). Atomic layer deposition of copper nitride film and its application to copper seed layer for electrodeposition. Thin Solid Films. 556. 10.1016/j.tsf.2014.01.034. (Year: 2014).*

(Continued)

*Primary Examiner* — Whitney Moore
(74) *Attorney, Agent, or Firm* — Greer Burns & Crain, Ltd.

(57) ABSTRACT

The present invention relates to a copper metal film to be used as a seed layer for electrodeposition for forming a copper interconnect for a semiconductor device, a method for preparing the same, and a method for forming a copper interconnect for a semiconductor device using the copper metal film.

19 Claims, 12 Drawing Sheets

(51) Int. Cl.
  *C23C 18/12*    (2006.01)
  *C23C 16/455*   (2006.01)
  *H01L 21/285*   (2006.01)
  *H01L 21/288*   (2006.01)
  *H01L 21/768*   (2006.01)
  *H01L 23/532*   (2006.01)

(52) U.S. Cl.
  CPC .... *H01L 23/53238* (2013.01); *H01L 21/2885* (2013.01); *H01L 21/76877* (2013.01)

(56) References Cited

FOREIGN PATENT DOCUMENTS

| KR | 10-2004-0076758 A | 9/2004 |
| KR | 10-2007-0051331 A | 5/2007 |
| KR | 10-2010-0025870 A | 3/2010 |

OTHER PUBLICATIONS

Int'l. Search Report of PCT/KR2014/012816 dated Mar. 30, 2015.
Zhengwen Li et al., "Thin, Continuous, and Conformal Copper Films by Reduction of Atomic Layer Deposited Copper Nitride", Chemical Vapor Deposition, 2006, vol. 12, pp. 435-441.
Jae-Min Park, "A study on the Atomic Layer Deposition of Copper Nitride Film and its Application to Seed Layer of Copper Interconnect", Aug. 2013, thesis, Graduate School of Sejong University Nano New Materials Engineering, pp. 1-88.

* cited by examiner

COPPER METAL FILM, METHOD FOR PREPARING THE SAME, AND METHOD FOR FORMING COPPER INTERCONNECT FOR SEMICONDUCTOR DEVICE USING THE SAME

TECHNICAL FIELD

The present invention relates to a copper metal film, a method for preparing the same, and a method for forming a copper interconnect for a semiconductor device using the copper metal film.

BACKGROUND

A copper film has been grown in a damascene pattern by electrodeposition in order to form a copper interconnect of an integrated circuit. A continuous copper seed layer having excellent step coverage is essential for high-quality electrodeposition since it provides a conductive substrate and has an important role in improving copper nucleation. Conventionally, a copper seed layer has been formed by using an ionized physical vapor deposition (i-PVD) method. However, as a minimum feature size decreases, the i-PVD method will confront the scaling problem.

According to the i-PVD method, a bottom corner of a pattern in a micro device is formed in a very small thickness and an overhang is formed at a trench/hole inlet portion, which results in poor step coverage. In this case, if a copper seed layer formed by the i-PVD method is not properly deposited or an overhang is formed to block the inlet portion, an empty space is formed therein. Such a problem is worsened in a dual damascene structure. According to the International Technology Roadmap for Semiconductors (ITRS), it is expected to be difficult to fill a dual damascene pattern having an aspect ratio of 2.0/1.8 for wire/via in 2017. This results from that it is difficult to form a continuous copper seed layer by a PVD method due to the limitation in step coverage. Meanwhile, U.S. Pat. No. 6,492,268 discloses "Method of forming a copper wiring in a semiconductor device", but uses a physical vapor deposition so as to still have the above-described problem.

Atomic layer deposition (ALD) of a copper film has been researched using organic copper compounds such as copper(II)-2,2,6,6-tetramethyl-3,5-heptandionate [$Cu(thd)_2$], copper(II) acetylacetonate [$Cu(acac)_2$], copper(II)-1,1,1,5,5,5-hexafluoroacetonate [$Cu(hfac)_2$] and its hydrate [$Cu(hfac)_2 \cdot xH_2O$], copper(I) N,N'-di-sec-butyl-acetamidinate [$(Cu(^sBu-Me-amd))_2$], bis(dimethylamino-2-propoxy)copper(II) [$Cu(dmap)_2$], bis(1-dimethylamino-2-methyl-2-butoxy)copper(II) [$Cu(dmamb)_2$], bis(1-(dimethylamino)propan-2-yloxy)copper(II), copper(II)(4-ethylamino-pent-3-ene-2-onate)$_2$, and Cu(ethylketoiminate)$_2$. As a reducing agent, hydrogen, hydrogen plasma, an alcohol or formalin, diethyl zinc ($Et_2Zn$), and formic acid/hydrazine have been used. Copper(II) (1,1,1,5,5,5-hexafluoroacetylacetonate) (trimethylvinylsilane) [Cu(hfac)(tmvs)], which is the most common CVD precursor, cannot be used as an ALD precursor since it does not provide self-limited ALD due to its disproportionation. $Cu(thd)_2$ and $Cu(acac)_2$, which are complexes of Cu(II) β-diketonate, have relatively low vapor pressures and low evaporation rates. Although fluorinated Cu(II) β-diketonate molecules such as $Cu(hfac)_2$ have a higher vapor pressure than non-fluorinated Cu(II) β-diketonate, fluorine atoms in the precursor cause poor adhesion of an ALD copper film to a tantalum-based barrier metal. Recently, a non-fluorinated copper precursor having a high vapor pressure has been synthesized. $(Cu(^sBu-Me-amd))_2$ and Cu(ethylketoiminate)$_2$ showed high vapor pressures, and were reduced by $H_2$ so that a pure copper film was deposited on a metal substrate. Further, $Cu(dmap)_2$ and $Cu(dmamb)_2$ have been researched as an ALD precursor using $Et_2Zn$ or hydrogen plasma as a reducing agent. However, a thermal ALD of copper using $NH_3$ and/or $H_2$ as a reducing agent has not yet been reported.

Further, a copper film was formed by reducing a copper oxide or copper nitride film. An ALD copper oxide film had a low growth rate of about 0.01 nm/cycle, and was deposited at 100° C. to 160° C. using bis(tri-n-butylphosphine)copper(I)acetylacetonate [($^nBu_3P)_2Cu(acac)$] and wet $O_2$ and could be reduced at 115° C. by performing a heat treatment with formic acid vapor. However, an oxidizing agent for ALD of copper oxide also oxidizes a barrier metal on which the copper seed layer is formed. A copper nitride film formed by ALD was deposited using $(Cu(^sBu-Me-amd))_2$ and $NH_3$, and reduced to metal copper at 225° C. by reducing annealing with $H_2(10\%)/N_2$ under 5 Torr. Although a copper film reduced from copper nitride by ALD had superior surface morphology and resistivity compared to those of a copper film formed by ALD, details of a process for the copper nitride by ALD have not been disclosed [Z. Li and R. G. Gordon, "Thin, Continuous, and Conformal Copper Films by Reduction of Atomic Layer Deposited Copper Nitride", Chemical Vapor Deposition, 2006, volume 12, pages 435-441]. Further, $(Cu(^sBu-Me-amd))_2$, which is a solid at room temperature, is more disadvantageous for mass production of semiconductor devices than a copper precursor which is a liquid at room temperature. Since copper atoms in a thin copper film easily aggregate with each other, it is very difficult to form a thin copper film with a high electric conductivity. If copper atoms in a thin copper film aggregate, the copper film cannot be a continuous film but has a surface portion where copper is not present. Such a discontinuous copper film has a high electric resistance and cannot be used as a seed layer for electrodeposition.

The present disclosure relates to a copper metal film, a method for preparing the same, and a method for forming a copper interconnect for a semiconductor device using the copper metal film as a seed layer. Further, the present disclosure provides a precursor for deposition of a copper metal film and a composition containing the same for deposition of a copper metal film. Furthermore, the present disclosure provides a copper interconnect for a semiconductor device formed by the method for forming a copper interconnect for a semiconductor device and a semiconductor device including the same.

However, problems to be solved by the present disclosure are not limited to the above-described problems. Although not described herein, other problems to be solved by the present disclosure can be clearly understood by those skilled in the art from the following descriptions.

Means for Solving the Problems

In accordance with a first aspect of the present disclosure, there is provided a method for preparing a copper metal film, including: supplying a copper aminoalkoxide-based precursor which is a liquid at a room temperature and a nitrogen element-containing gas alternately in an atomic layer deposition chamber to form a copper nitride film on a substrate; and annealing the copper nitride film for reduction thereof to form a copper metal film.

In accordance with a second aspect of the present disclosure, there is provided a copper metal film prepared by the method according to the first aspect of the present disclosure.

In accordance with a third aspect of the present disclosure, there is provided a method for forming a copper interconnect for a semiconductor device, including: electrodepositing a copper on a seed layer to form a copper metal film for interconnect, wherein the seed layer is a copper metal film prepared by the method according to the first aspect of the present disclosure.

In accordance with a fourth aspect of the present disclosure, there is provided a copper interconnect for a semiconductor device, formed by the method according to the third aspect of the present disclosure.

In accordance with other aspects of the present disclosure, there is provided a semiconductor device including: a precursor for deposition of a copper metal film, including a copper aminoalkoxide-based precursor which is a liquid at a room temperature; a composition for deposition of a copper metal film, containing the copper aminoalkoxide-based precursor which is a liquid at a room temperature; and the copper interconnect for a semiconductor device.

Effects of the Invention

In an embodiment of the present disclosure, since an atomic layer deposition (ALD) method using a reaction gas without containing oxygen (such as a nitrogen element-containing gas) is employed, oxidation of a copper diffusion barrier film does not occur when a copper metal film is formed, and, thus, it is possible to deposit a high-quality copper metal film having excellent adhesion, excellent step coverage, precise thickness controllability, low surface roughness, and low sheet resistance. Such a copper metal film can be advantageously used as a seed layer for electrodeposition.

Since a continuous copper film having a small thickness can be prepared using the above-described method for preparing a copper metal film according to the present disclosure, it is possible to form a seed layer for electrodeposition in a short time and also possible to produce more semiconductor devices per unit time with a semiconductor production apparatus that performs copper ALD.

If a thick seed layer is formed to a uniform thickness on a fine copper interconnect, for example, a copper interconnect employing a design rule of 28 nm or less, the insides of a groove and a hole are filled, and, thus, an aspect ratio of the insides of the groove and the hole is greatly increased. Therefore, it is difficult to completely fill the groove and the hole with copper in a subsequent electrodeposition process. However, it is possible to form a copper metal seed layer to a very small thickness by the method for preparing a copper metal film according to an embodiment of the present disclosure. Accordingly, a seed layer can be formed with only slightly increasing an aspect ratio on a very fine copper interconnect, which is advantageous in a subsequent electrodeposition process for forming a copper metal film for interconnect.

Since the method for preparing a copper metal film to be used as a seed layer according to an embodiment of the present disclosure does not use a reaction gas containing oxygen in an ALD process, it is possible to prevent or solve the problem of the conventional technology, i.e., a decrease in reliability of a semiconductor device using a copper interconnect due to oxidation of a copper diffusion barrier film to cause decrease in adhesion to a copper layer, and an increase in electromigration of copper.

In an embodiment of the present disclosure, a copper aminoalkoxide-based precursor in a liquid state is used. In this regard, a vaporization rate of a solid precursor is proportional to a surface area of the solid. A surface area of the solid is changed as a source material is vaporized, and it is difficult to form the same surface area all the time even with the same amount of a source material. Therefore, it is difficult to constantly maintain a supplying amount of a source material in a semiconductor device mass production apparatus. A liquid accommodated in a cylindrical container commonly used in the semiconductor device mass production apparatus is not changed in its surface area even when the liquid is vaporized and a liquid level is changed, which does not cause such a problem. Further, in a liquid state, a source material can be supplied at a constant rate using a liquid delivery system.

In the ALD process, source material gases are separately supplied. Therefore, only molecules adsorbed to a substrate surface participate in a chemical reaction to lead a self-limiting reaction. Therefore, a film is grown at the same rate on an entire surface of a substrate, and the rate is determined depending on chemical characteristics of the source material, an exposure amount, and a reaction temperature. Thus, due to such features it is possible to form a uniform film on a pattern having excellent step coverage on a pattern even with a high aspect ratio.

Accordingly, in accordance with an embodiment of the present disclosure, it is possible to form a thin copper metal film having a thickness of 10 nm or less with excellent conductivity. The electric conductivity of the thin copper metal film is similar to that obtained by the conventional sputtering method.

In an embodiment of the present disclosure, a copper metal film for interconnect prepared by electrodeposition using the thin copper metal film as a seed layer has a higher conductivity (lower electric resistance) and a smoother copper film surface than a copper metal film prepared by electrodeposition using a ruthenium metal film as a seed layer.

The method according to an embodiment of the present disclosure has a higher film growth rate per ALD cycle and a higher conductivity of the formed copper metal film for a seed layer compared to the conventionally known method. A Cu amidinate precursor known as being able to form a copper metal film having a high conductivity by an ALD method is a solid at room temperature, but $Cu(dmamb)_2$, which is a precursor used in an embodiment of the present disclosure, is a liquid at room temperature and thus more advantageous for mass production of semiconductor devices.

BEST MODE FOR CARRYING OUT THE INVENTION

Figure 1:
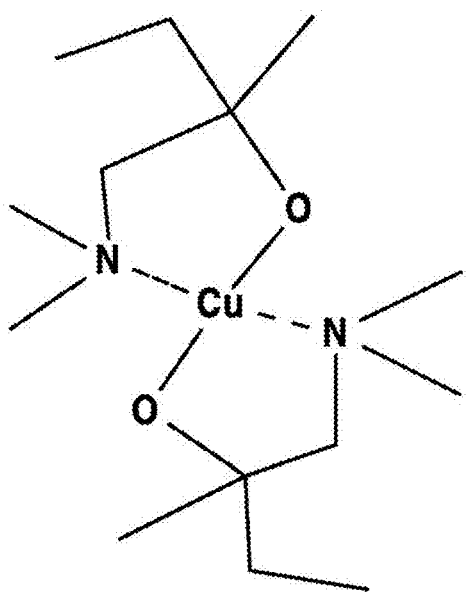
FIG. 1 is a chemical structural formula of an organometallic copper compound in accordance with an example of the present disclosure.
Figure 2:
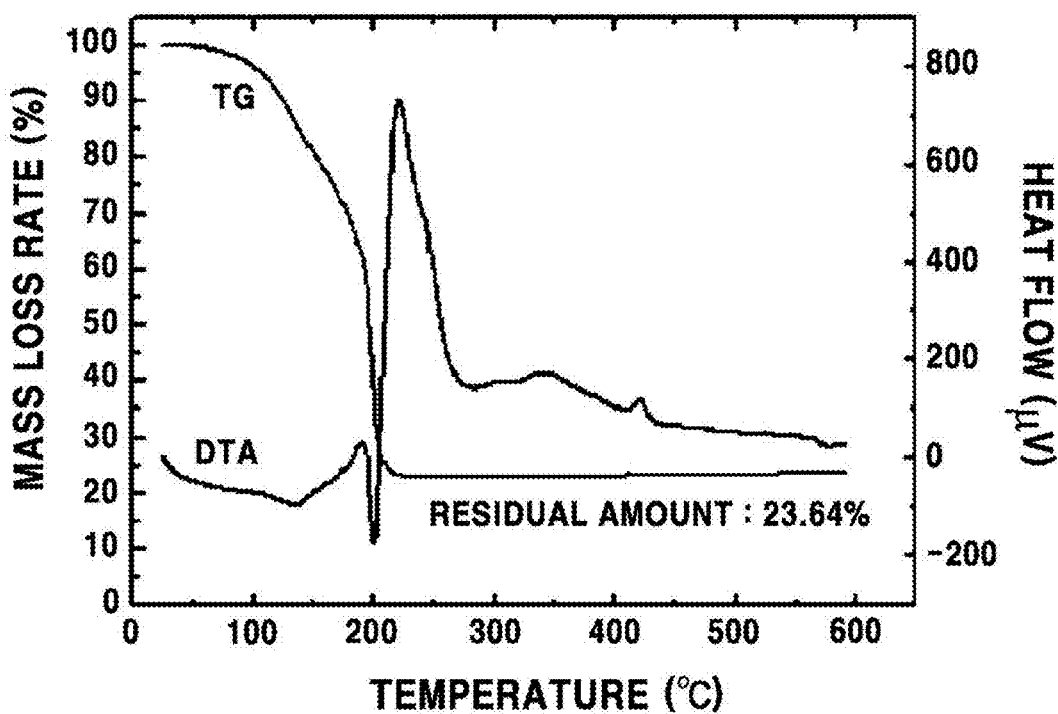
FIG. 2 is a graph showing thermal gravity analysis/differential thermal analysis (TGA/DTA) results of an organometallic copper compound in accordance with an example of the present disclosure.
Figure 3:
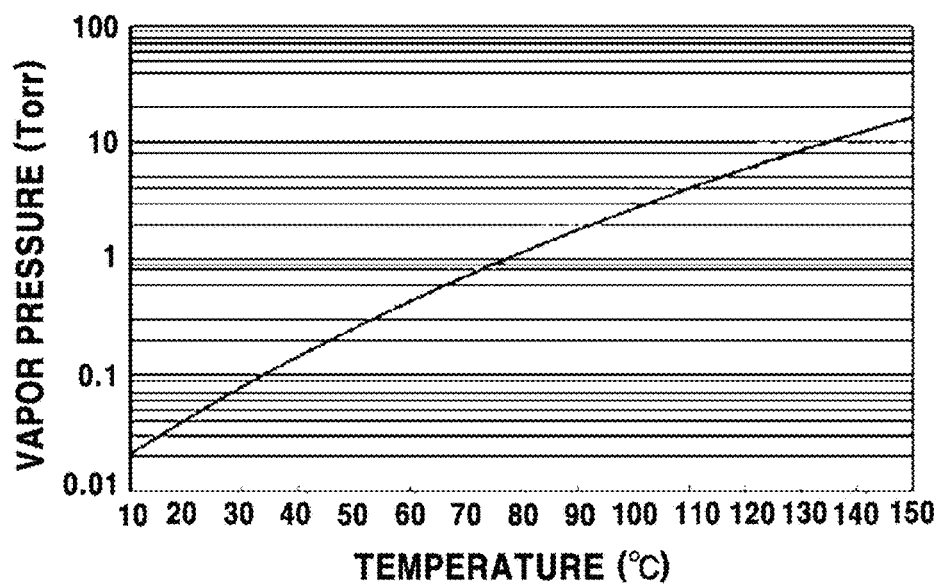
FIG. 3 is a graph showing a vapor pressure characteristic of an organometallic copper compound in accordance with an example of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the another element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereinafter, embodiments of the present disclosure will be described in detail. However, the present disclosure may not be limited to the following embodiments.

In accordance with a first aspect of the present disclosure, there is provided a method for preparing a copper metal film, including: supplying a copper aminoalkoxide-based precursor which is a liquid at a room temperature and a nitrogen element-containing gas alternately in an atomic layer deposition chamber to form a copper nitride film on a substrate; and annealing the copper nitride film for reduction thereof to form a copper metal film.

In an embodiment of the present disclosure, the copper aminoalkoxide-based precursor which is a liquid at a room temperature may include $Cu(dmamb)_2$ to represent bis(1-dimethylamino-2-methyl-2-butoxy)copper(II), but may not be limited thereto.

In an embodiment of the present disclosure, a copper aminoalkoxide-based precursor, which can be vaporized at a temperature of 100° C. or less, may be used in the present disclosure. Particularly, the $Cu(dmamb)_2$ is a liquid at room temperature and thus advantageous for mass production of semiconductor devices.

In an embodiment of the present disclosure, the nitrogen element-containing gas may include a gas selected from the group of $NH_3$ gas, $N_2H_4$ gas, $N_2$ gas, a mixture gas of $N_2$ and $H_2$, plasma-activated $NH_3$ gas, plasma-activated $N_2H_4$ gas, plasma-activated $N_2$ gas, a mixture gas of plasma-activated $N_2$ and $H_2$, a mixture gas of $NH_3$ gas and an inert gas, a mixture gas of $N_2H_4$ gas and an inert gas, a mixture gas of plasma-activated $NH_3$ gas and an inert gas, a mixture gas of plasma-activated $N_2H_4$ gas and an inert gas, and combinations thereof, but may not be limited thereto.

In an embodiment of the present disclosure, the inert gas may include a member selected from the group consisting of argon, helium, neon, and combinations thereof, but may not be limited thereto.

In an embodiment of the present disclosure, a temperature of the substrate may be in a range of from about 100° C. to about 160° C., but may not be limited thereto.

In an embodiment of the present disclosure, the annealing may be performed at a temperature of about 150° C. or higher in a reducing atmosphere or vacuum, but may not be limited thereto.

The annealing may be performed at a temperature of about 150° C. or higher, and may be performed in a temperature range in which the copper nitride film or the formed copper metal film does not aggregate. By way of example, a temperature for the annealing may be affected by a thickness of the copper nitride film and may be in a range of from about 150° C. to about 400° C., but may not be limited thereto.

In an embodiment of the present disclosure, the reducing atmosphere in which the annealing is performed may include hydrogen, argon, helium, or nitrogen gas, but may not be limited thereto. By way of example, a pressure of the reducing atmosphere in which the annealing is performed may be a normal pressure or less, but may not be limited thereto.

In an embodiment of the present disclosure, the annealing may be performed by a vacuum heat treatment, but may not be limited thereto.

In an embodiment of the present disclosure, a sheet resistance of the copper metal film or thin film prepared by the above-described method may be about 500Ω/☐ or less, but may not be limited thereto. By way of example, a sheet resistance of the copper metal film is inversely proportional to a thickness thereof. If a thickness of the copper metal film is about 10 nm, a sheet resistance may be about 5Ω/☐; if a thickness of the copper metal film is about 4 nm (4.2 nm), a sheet resistance may be about 70Ω/☐; and if the copper metal film is formed to a small thickness of about 1 nm, a sheet resistance may be about 500Ω/☐, but may not be limited thereto.

In an embodiment of the present disclosure, a thickness of the copper metal film prepared by the above-described method may be about 10 nm or less, but may not be limited thereto. By way of example, a thickness of the copper metal film may be about 10 nm or less, from about 1 nm to about 10 nm or less, from about 1 nm to about 9 nm or less, from about 1 nm to about 8 nm or less, from about 1 nm to about 7 nm or less, from about 1 nm to about 6 nm or less, from about 1 nm to about 5 nm or less, from about 1 nm to about 4 nm or less, from about 1 nm to about 3 nm or less, or from about 1 nm to about 2 nm or less, but may not be limited thereto.

In an embodiment of the present disclosure, a thickness of the copper metal film prepared by the above-described method may be from about 1 nm to about 10 nm, and a sheet resistance of the copper metal film may be from about 5Ω/☐ to about 500Ω/☐, but may not be limited thereto.

In accordance with a second aspect of the present disclosure, there is provided a copper metal film prepared by the method according to the first aspect of the present disclosure.

In an embodiment of the present disclosure, the copper metal film may be prepared by supplying a copper aminoalkoxide-based precursor which is a liquid at a room temperature and a nitrogen element-containing gas alternately in an atomic layer deposition chamber to form a copper nitride film on a substrate, and annealing the copper nitride film for reduction thereof, but may not be limited thereto.

In an embodiment of the present disclosure, a sheet resistance of the copper metal film may be about 500Ω/☐ or less, but may not be limited thereto. By way of example, a sheet resistance of the copper metal film is inversely proportional to a thickness thereof. If a thickness of the copper metal film is about 10 nm, a sheet resistance may be about 5Ω/☐; if a thickness of the copper metal film is about 4 nm (4.2 nm), a sheet resistance may be about 70Ω/☐; and if the copper metal film is formed to a small thickness of about 1 nm, a sheet resistance may be about 500Ω/☐, but may not be limited thereto.

In an embodiment of the present disclosure, a thickness of the copper metal film may be about 10 nm or less, but may not be limited thereto. By way of example, a thickness of the copper metal film may be about 10 nm or less, from about 1 nm to about 10 nm or less, from about 1 nm to about 9 nm or less, from about 1 nm to about 8 nm or less, from about 1 nm to about 7 nm or less, from about 1 nm to about 6 nm or less, from about 1 nm to about 5 nm or less, from about 1 nm to about 4 nm or less, from about 1 nm to about 3 nm or less, or from about 1 nm to about 2 nm or less, but may not be limited thereto.

In an embodiment of the present disclosure, a thickness of the copper metal film may be from about 1 nm to about 10 nm, and a sheet resistance of the copper metal film may be from about 5Ω/☐ to about 500Ω/☐, but may not be limited thereto.

In an embodiment of the present disclosure, the copper metal film may have low surface roughness and low resistivity, but may not be limited thereto. The resistivity may vary depending on a thickness of the copper metal film. Since a mean free path of electrons in Cu is about 50 nm, the resistivity in a thinner film is greatly increased. Conventionally, it has been reported that the resistivity is about 50 μΩ·cm when a thickness is about 1 nm and the resistivity is about 5 μΩ·cm when a thickness is about 10 nm. In an embodiment of the present disclosure, if a thickness of the copper metal film is about 4 nm, the resistivity is about 30 μΩ·cm.

In an embodiment of the present disclosure, the surface roughness may be measured using an atomic force microscope (AFM). By way of example, a copper metal film (film thickness of about 4.2 nm) reduced after growth on Ru (RMS roughness of about 1.5 nm) formed by ALD may have a RMS (root mean square) roughness of about 1.2 nm.

In accordance with a third aspect of the present disclosure, there is provided a method for forming a copper interconnect for a semiconductor device, including: electrodepositing a copper on a seed layer to form a copper metal film (II) for interconnect, wherein the seed layer is a copper metal film (I) prepared by the method according to the first aspect of the present disclosure.

In an embodiment of the present disclosure, the method for forming a copper interconnect for a semiconductor device may include: supplying a copper aminoalkoxide-based precursor which is a liquid at a room temperature and a nitrogen element-containing gas alternately in an atomic layer deposition chamber to form a copper nitride film on a substrate; annealing the copper nitride film for reduction thereof to form a copper metal film (I) as a seed layer; and electrodepositing a copper on the seed layer to form a copper metal film (II) for interconnect, but may not be limited thereto.

In an embodiment of the present disclosure, the copper metal film (II) formed on the seed layer may be formed to have a desired pattern shape and/or thickness of a copper interconnect for a semiconductor device, but may not be limited thereto.

In an embodiment of the present disclosure, the electrodeposition method may employ electrodeposition methods and apparatuses typically used in the art, but may not be limited thereto.

In an embodiment of the present disclosure, the copper metal film (II) formed by the electrodepositing may have low surface roughness and low resistivity, but may not be limited thereto.

In an embodiment of the present disclosure, prior to electrodeposition of the copper, the seed layer may be pre-treated using an acidic aqueous solution so as to remove a native oxide. Meanwhile, in the case of a ruthenium substrate formed by ALD, a native oxide may be electrochemically removed by a coulometric reduction method (CRM) in an aqueous electrolytic solution containing tetramethylammonium hydroxide (TMAH). Cu electrodeposition may be performed in a 3-electrode system including the pre-treated seed layer, 99.9% Cu wire, and an Ag/AgCl electrode. In an embodiment of the present disclosure, the aqueous electrolytic solution may include about 0.25 M $CuSO_4$ and about 1.0 M $H_2SO_4$, but may not be limited thereto.

In an embodiment of the present disclosure, the aqueous electrolytic solution may include a composition including about 88 μM polyethylene glycol (PEG, 3400 g/mol, Aldrich), about 1 mM NaCl, and about 50 μM bis(3-sulfopropyl)disulfide (SPS, Raschig GmbH), as an inhibitor-accelerator additive system, but may not be limited thereto.

In accordance with a fourth aspect of the present disclosure, there is provided a copper interconnect for a semiconductor device, formed by the method according to the third aspect of the present disclosure.

In an embodiment of the present disclosure, the copper interconnect for a semiconductor device may be formed by a method including: supplying a copper aminoalkoxide-based precursor which is a liquid at a room temperature and a nitrogen element-containing gas alternately in an atomic layer deposition chamber to form a copper nitride film on a substrate; annealing the copper nitride film for reduction thereof to form a copper metal film (I); and electrodepositing a copper on the copper metal film (I) as the seed layer to form a copper metal film (II), but may not be limited thereto.

In an embodiment of the present disclosure, the copper metal film (II) formed on the seed layer may be formed to have a desired pattern shape and/or thickness of a copper interconnect for a semiconductor device, but may not be limited thereto.

In an embodiment of the present disclosure, the copper interconnect for a semiconductor device may have low surface roughness and low resistivity, but may not be limited thereto.

In accordance with a fifth aspect of the present disclosure, there is provided a semiconductor device including a copper interconnect for a semiconductor device according to the fourth aspect of the present disclosure.

All the descriptions about the first aspect to the fourth aspect may be applied to the copper interconnect for a semiconductor device according to the present aspect.

In accordance with a sixth aspect of the present disclosure, there is provided a composition for deposition of a copper metal film, including a copper aminoalkoxide-based precursor which is a liquid at a room temperature.

In an embodiment of the present disclosure, the composition includes the copper aminoalkoxide-based precursor which can be vaporized at a temperature of 100° C. or less, and thus advantageous for mass production of semiconductor devices. Particularly, the composition includes Cu(dmamb)$_2$ as the copper aminoalkoxide-based precursor which is a liquid at room temperature.

In an embodiment of the present disclosure, when an atomic layer deposition (ALD) method using a reaction gas without containing oxygen (such as a nitrogen element-containing gas) is employed with the composition for deposition of a copper metal film, oxidation of a copper diffusion barrier film does not occur when a copper metal film is formed, and, thus, it is possible to deposit a high-quality copper metal film having excellent adhesion, excellent step coverage, precise thickness controllability, low surface roughness, and low sheet resistance. Such a copper metal film can be advantageously used as a seed layer for electrodeposition.

Since a continuous copper film having a small thickness can be prepared using the ALD as mentioned above with using the composition for deposition of a copper metal film according to the present disclosure, it is possible to form a seed layer for electrodeposition in a short time and also possible to produce more semiconductor devices per unit time with a semiconductor production apparatus that performs copper ALD.

In an embodiment of the present disclosure, a sheet resistance of the copper metal film or thin film prepared by the ALD as mentioned above with using the composition for deposition of a copper metal film may be about 500Ω/□ or less, but may not be limited thereto. By way of example, a sheet resistance of the copper metal film is inversely proportional to a thickness thereof. If a thickness of the copper metal film is about 10 nm, a sheet resistance may be about 5Ω/□; if a thickness of the copper metal film is about 4 nm (4.2 nm), a sheet resistance may be about 70Ω/□; and if the copper metal film is formed to a small thickness of about 1 nm, a sheet resistance may be about 500Ω/□, but may not be limited thereto.

MODE FOR CARRYING OUT THE INVENTION

Hereinafter, examples will be described in more detail with reference to the accompanying drawings. However, the following examples are provided only for more easily understanding of the present disclosure, but the present disclosure is not limited thereto.

EXAMPLES

1. Formation of Copper Metal Film (I) Seed Layer

A copper metal film and a copper nitride film were grown in a hot-wall tube reactor by alternately supplying liquid Cu(dmamb)$_2$ and a reactant. The Cu(dmamb)$_2$ was heated to 50° C. and vapor thereof was delivered into the reactor without a carrier gas. The precursor delivery line was maintained at from 85° C. to 100° C., thereby suppressing condensation of the precursor. Hydrogen (99.999%) for a Comparative Example of not using nitrogen element-containing gas] and ammonia for an Example of the present disclosure (99.9995%) were used as the reactant for preparing the copper metal film and copper nitride film, respectively. Between the processes of supplying the precursor and the reactant was supplied, argon (99.999%) was used as a purge gas. An exposure of the precursor and the reactant was regulated by a pulse time at fixed pulse pressures of 133 Pa, 1,200 Pa, and 800 Pa, of Cu(dmamb)$_2$, H$_2$, and NH$_3$ respectively. The films were mainly prepared on a Ru (30 nm)/SiO$_2$ (100 nm)/Si wafer by air-exposed ALD. A ruthenium film formed by ALD was prepared using (2,4-dimethylpentadienyl)(ethylcyclopentadienyl)ruthenium [Ru(DMPD)(EtCp)] and O$_2$ at 280° C. The growth of the copper nitride film was in-situ monitored during ALD using a quartz crystal microbalance (QCM) system (TM-400, Maxtek, USA) including an AT-type quartz crystal resonator (TAN06G, tangidyne, USA) installed in a bakeable single sensor feed-through kit (BSH-150, Inficon, USA). A sensor frequency and a mass resolution were 0.03 Hz and 0.375 ng/cm$^2$, respectively. In order to obtain a copper metal film from a copper nitride film formed by the ALD, the copper nitride film was annealed at different temperatures ranging from 150° C. to 250° C. for 30 minutes in a hydrogen atmosphere at 133 Pa.

A thickness and step coverage of the film were examined using a cross-sectional transmission electron microscopic (TEM) image (JE-21000F, JEOL, Japan). The surface morphology was observed using a scanning electron microscope (SEM, S-4700, Hitachi, Japan) and an atomic force microscope (AFM, XE-150, Park Systems). A sheet resistance of the film stack was measured using a 4-point probe, and a sheet resistance (Rs) of the copper metal film was calculated using a resistance of a ruthenium substrate exposed to the same thermal budget by an ALD process and a annealing process. A sheet resistance of the ALD ruthenium substrate was changed by less than 1% after annealing at 200° C. in a hydrogen atmosphere for 1 hour. The resistivity was calculated by multiplying the sheet resistance by a thickness of the Cu film determined by the TEM. Further, crystal structures of the copper metal film and the copper nitride film were examined by Raman spectrometry (inVia™ Raman microscopes, Renishaw, UK) using a 514.5 nm argon ion excitation source. The optical band gap was measured by UV-Visible-NIR spectrophotometric method (Cary 5000, Varian, Switzerland). Impurity contents in the films were analyzed by an X-ray photoelectron spectroscopy (XPS) system (ESCALAB 250 XPS System, Thermo Fisher Scientific, UK) using a monochromatic Al Ka (1486.6 eV) X-ray source.

2. Preparation of Copper Metal Film (II) for Interconnect by Electrodeposition Prior to electrodeposition of copper, the copper metal film seed layer was pre-treated using an aqueous solution containing 0.020 M citric acid and 0.034 M KOH for 30 seconds to remove a native oxide. In the case of a ruthenium substrate formed by ALD, a native oxide was electrochemically removed by a coulometric reduction method (CRM) in an aqueous electrolytic solution containing 0.05 M tetramethylammonium hydroxide (TMAH). The potential was swept from an open circuit potential (OPC) to −1.1 V (vs. Ag/AgCl) at a scan rate of 10 mV/s. Cu electrodeposition was performed in a 3-electrode system including the pre-treated seed layer or ruthenium substrate, 99.9% Cu wire, and an Ag/AgCl electrode. The aqueous electrolytic solution included 0.25 M $CuSO_4$ and 1.0 M $H_2SO_4$. A combination of 88 μM polyethylene glycol (PEG, 3400 g/mol, Aldrich), 1 mM NaCl, and 50 μM bis(3-sulfopropyl)disulfide (SPS, Raschig GmbH) was added as an inhibitor-accelerator additive system into the electrolytic solution. A Cu film was deposited at an applied potential of −600 mV (vs. Ag/AgCl). Cu electrodeposition and CRM were performed by a potentiostat (PAR 273A, EG&G Princeton Applied Research Corporation).

<Characterization>

Figure 4A:
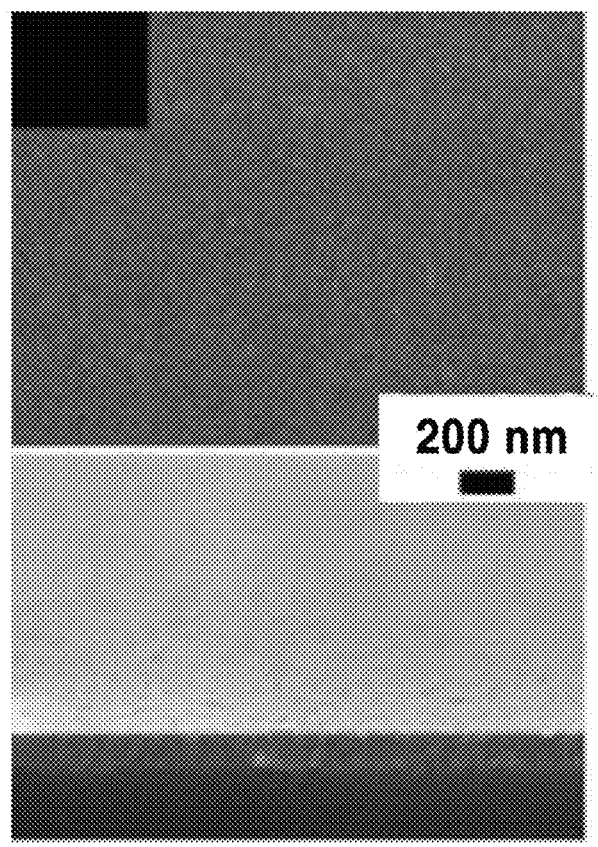
FIG. 4A to FIG. 4F are FE-SEM images of a copper metal film in accordance with an Comparative Example.
Figure 4B:
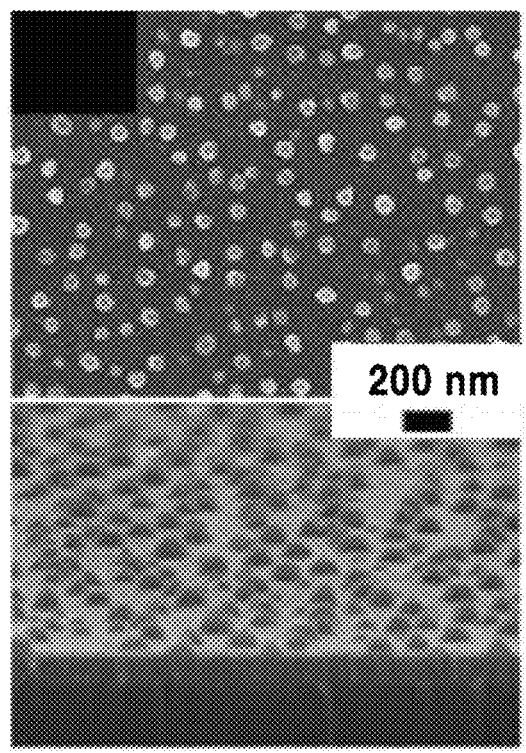
Figure 4C:
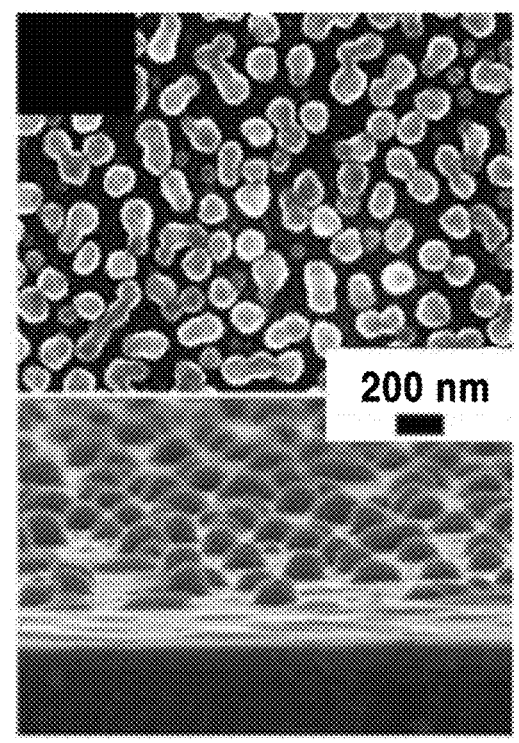
Figure 4D:
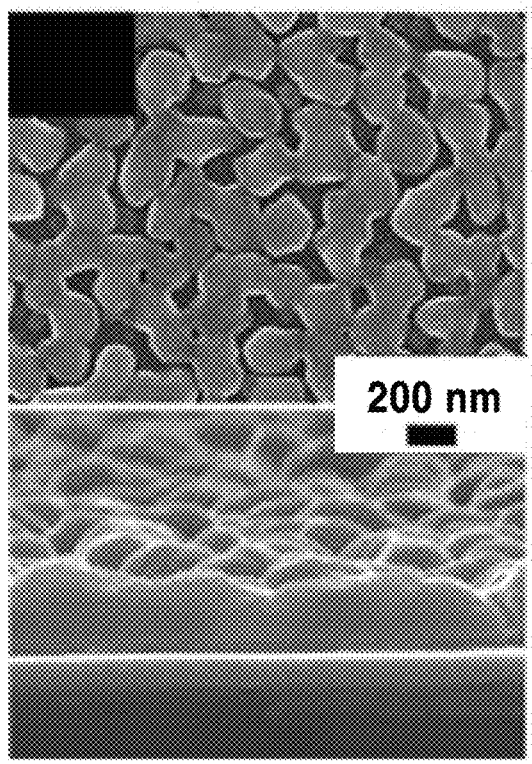
Figure 4E:
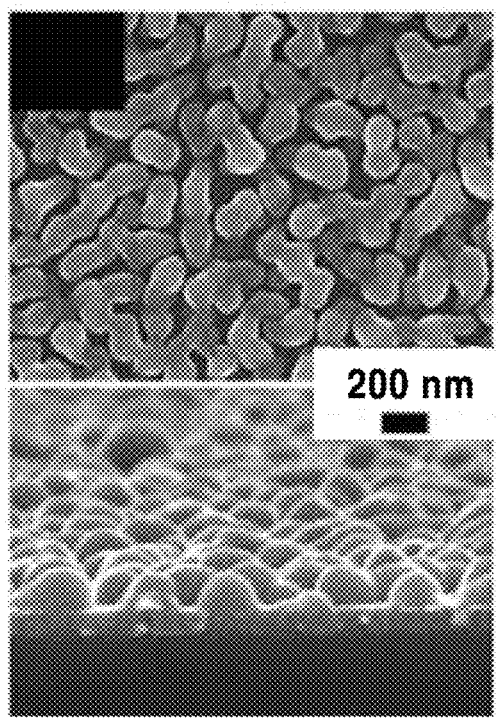
Figure 4F:
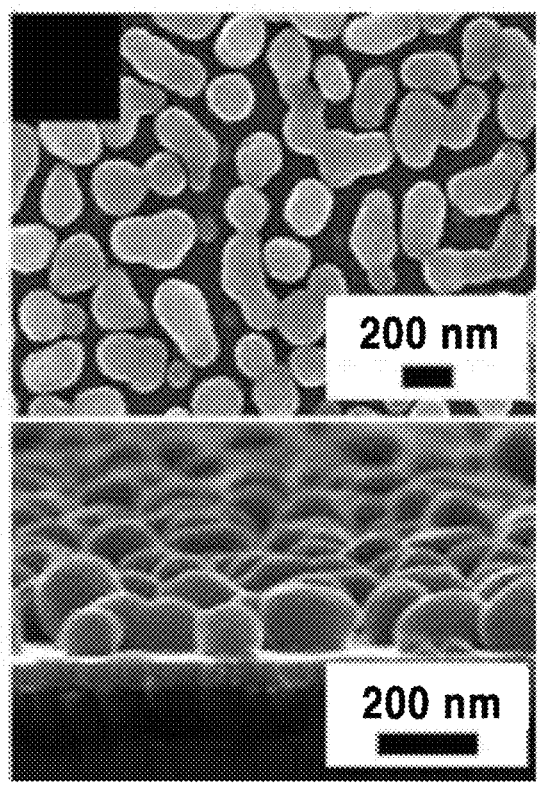
Figure 5A:
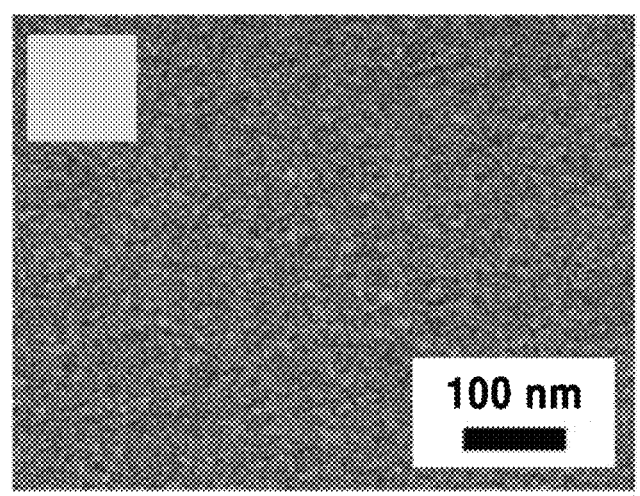
FIG. 5A to FIG. 5D are FE-SEM images of a copper nitride film in accordance with an example of the present disclosure.
Figure 5B:
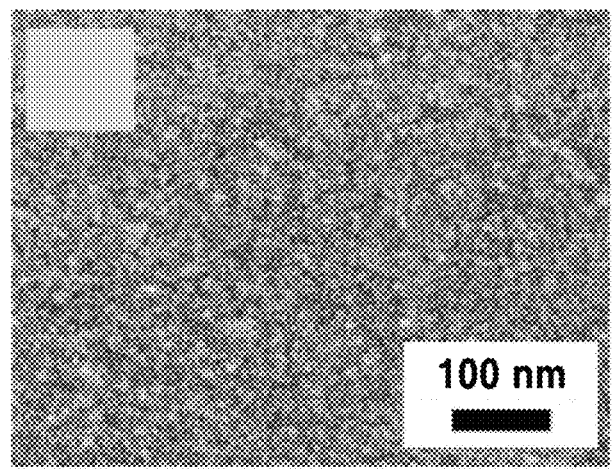
Figure 5C:
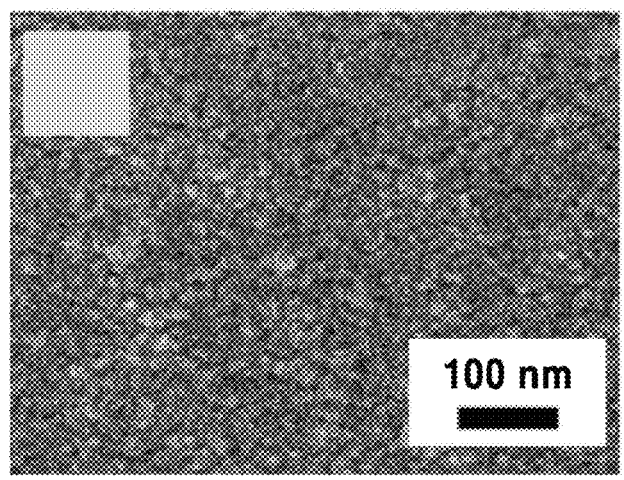
Figure 5D:
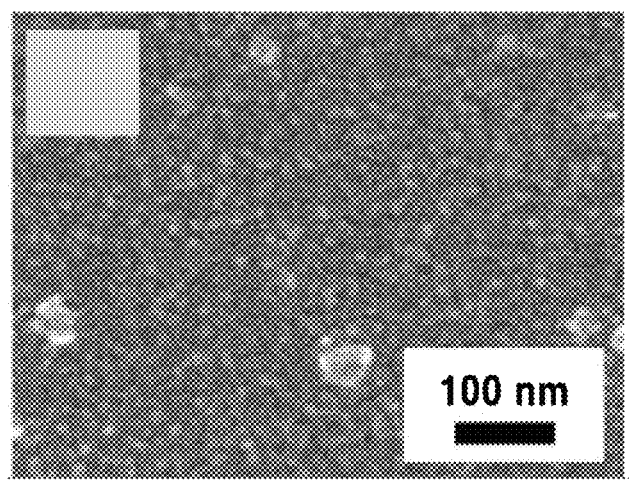

Field emission scanning electron microscope (FE-SEM; JE-21000F, JEOL) images (plan views and bird's eye views) of a copper metal film prepared by alternate exposures to $Cu(dmamb)_2$ and $H_2$ in the above Comparative Example were as shown in FIG. 4B to FIG. 4F. To be specific, the upper image of FIG. 4A is an SEM image of a ruthenium substrate formed by ALD before alternate exposures to $Cu(dmamb)_2$, and the upper images of FIG. 4B and FIG. 4F are SEM images of copper metal films formed on the ruthenium substrate at 120° C. (FIG. 4B), 140° C. (FIG. 4C), 160° C. (FIG. 4D), 180° C. (FIG. 4E), and 200° C. (FIG. 4F), respectively as Comparative Examples. The lower images of FIG. 4B to FIG. 4F show the surface morphology of the copper metal film deposited on the ruthenium substrate. Amounts of the exposure to $Cu(dmamb)_2$ and $H_2$ were fixed to $3\times10^6$ L and $1\times10^9$ L, respectively. When the copper film was formed, the number of ALD cycles was fixed to 100. A copper island formed at from 120° C. to 140° C. was concentrated but not dispersed, and was not connected to each other due to a low nucleation and growth rate. The copper metal film was formed when the deposition temperature was increased to 160° C. However, nucleation of a copper metal film on the ruthenium film by air-exposed ALD was still poor, resulting in rough surface morphology and poor connectivity between grains. A thickness of the film deposited at from 160° C. to 200° C. was about 100 nm, which corresponds to about 1 nm/cycle. Therefore, the growth rate was much higher than a growth rate of an atomic monolayer (about 0.2 nm), and thermal decomposition of the copper precursor was dominant at 160° C. or more.

Meanwhile, FE-SEM (JE-21000F, JEOL) images of a copper nitride film prepared by ALD in the above Example of the present disclosure were as shown in FIG. 5A to FIG. 5D. To be specific, FIG. 5A to FIG. 5D are surface SEM images of the films deposited at 100° C. (FIG. 5A), 120° C. (FIG. 5B), 140° C. (FIG. 5C), and 160° C. (FIG. 5D), respectively. Amounts of the exposure to the copper precursor and $NH_3$ were fixed to $3\times10^6$ L and $1\times10^9$ L, respectively. When the film was formed, the number of ALD cycles was fixed to 50, and the film was deposited on a ruthenium substrate by ALD. By comparison of the SEM images, it can be seen that the copper nitride film (FIG. 5A-5D) (the Examples of the present disclosure) formed by ALD has a very smooth surface as compared with the copper metal film (FIG. 4B-4F) (the Comparative Examples) formed by ALD.

Figure 6:
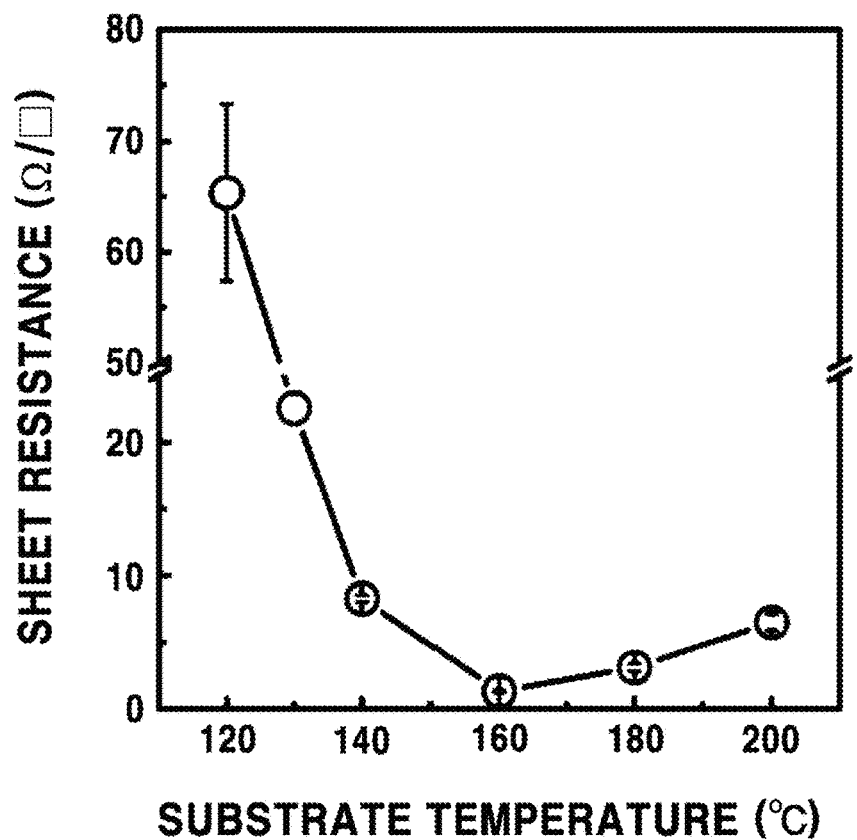
FIG. 6 is a graph showing a sheet resistance of a copper metal film in accordance with a Comparative Example.

A sheet resistance of a copper metal film prepared by alternate exposure to $Cu(dmamb)_2$ and $H_2$ as a function of deposition temperature in the Comparative Example was measured using a 4-point probe as shown in FIG. 6. FIG. 6 shows a sheet resistance of a copper metal film deposited for 100 cycles. The lowest sheet resistance was obtained at 160° C. At a temperature of more than 160° C., as the deposition temperature was increased, the sheet resistance and surface roughness was increased due to agglomeration of copper. The resistivity of the copper metal film deposited at 160° C. and having a thickness of 105 nm was calculated as 14 μΩ·cm which is higher than the resistivity of a copper metal film formed by PVD and having the same thickness.

Figure 7:
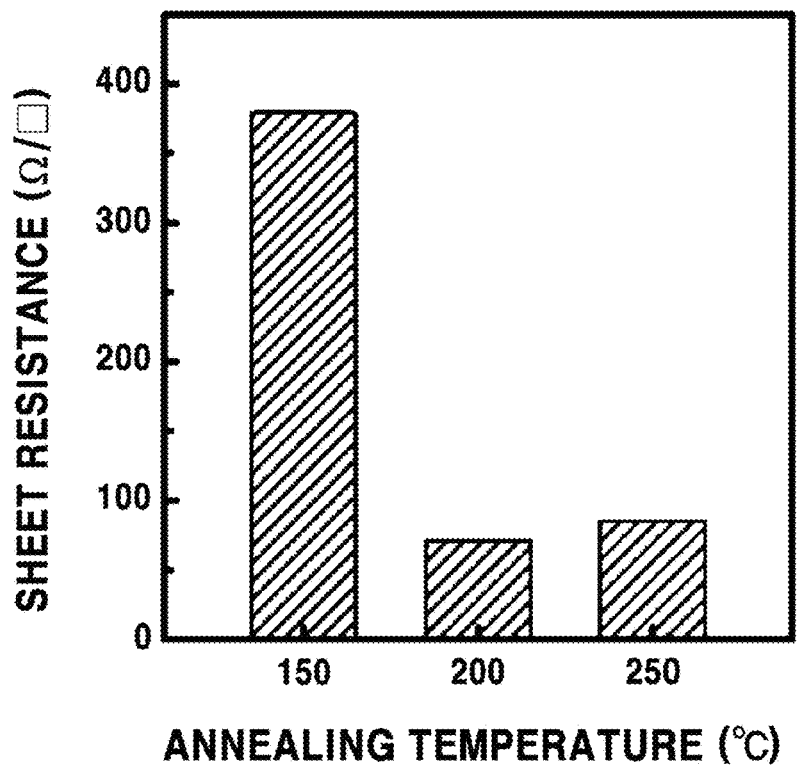
FIG. 7 is a graph showing a sheet resistance of a copper nitride film in accordance with an example of the present disclosure.

FIG. 7 shows a sheet resistance of a copper nitride film formed by ALD after reducing annealing at different temperatures in accordance of the Example of the present disclosure. The copper nitride film formed by ALD has a very high resistivity. When the copper nitride film formed by ALD was deposited on a ruthenium substrate, a sheet resistance was changed by less than 1% and a sheet resistance of a copper nitride film formed by ALD on a glass substrate was out of the range of a 4-point probe. However, the sheet resistance of the film was decreased after annealing. As illustrated in FIG. 7, the lowest sheet resistance of 71Ω/□ was obtained after annealing at 200° C. A thickness of the ALD copper nitride film annealed in a $H_2$ atmosphere at 133 Pa for 30 minutes was decreased from 5.1 nm (before annealing) to 4.2 nm (after annealing). The resistivity of the reduced copper metal film was calculated as 30 μΩ·cm, as compared with the copper metal film formed by PVD and having the same thickness.

Figure 8:
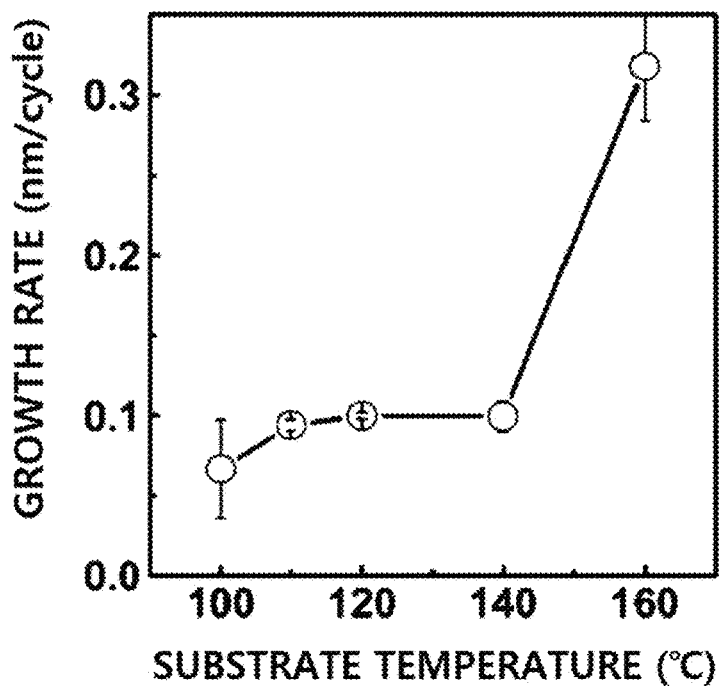
FIG. 8 is a graph showing an ALD growth rate of a copper nitride film depending on a substrate temperature in accordance with an example of the present disclosure.

In order to obtain a smooth continuous copper metal film seed layer, a copper nitride film formed by ALD was examined. The growth of the film was tested as a function of exposure to $Cu(dmamb)_2$ and $NH_3$ at 120° C. A deposition reaction of the film was a self-limiting reaction. A mass gain per ALD cycle determined by measurement of a QCM (quartz crystal microbalance) was saturated when an exposure amount of $Cu(dmamb)_2$ was $5\times10^6$ L in the case of an exposure amount of $NH_3$ fixed to $1\times10^9$ L and when an exposure amount of $NH_3$ was $5\times10^8$ L in the case of an exposure amount of $Cu(dmamb)_2$ fixed to $5\times10^6$ L. FIG. 8 is a graph showing a growth rate per deposition cycle, as a function of deposition temperature, obtained by QCM and calibrated by TEM, and corresponds to a case where an exposure amount of $Cu(dmamb)_2$ is $5\times10^6$ L and an exposure amount of $NH_3$ is $1\times10^9$ L. These films were grown on a ruthenium substrate and a silicon oxide substrate. A temperature of the substrates was 100° C. or more. A constant growth rate region (ALD window) was in a range of from 110° C. to 140° C., which is lower than 160° C. as a deposition temperature of an ALD copper nitride using $(Cu(^sBu-Me-amd))_2$. The growth rate of the film on the two substrates, i.e., the ruthenium and silicon oxide substrates, was constantly maintained in a temperature range of from 120° C. to 140° C. at about 0.1 nm/cycle, which is five or more times higher than 0.02 nm/cycle(=0.2 Å/cycle) as a growth rate of a film formed by ALD using $(Cu(^sBu-Me-amd))_2$ [Z. Li and R. G. Gordon, "Thin, Continuous, and Conformal Copper Films by Reduction of Atomic Layer Deposited Copper Nitride", Chemical Vapor Deposition, 2006, volume 12, pages 435-441]. The film growth rate was rapidly increased when the substrate temperature was increased to 160° C., which was caused by thermal decomposition of $Cu(dmamb)_2$. A copper nitride film formed at 160° C. has excellent step coverage as compared with i-PVD. Thus, a copper metal film formed by reducing the copper nitride film can be used as a seed layer for electrodeposition. A high film growth rate per gas supply cycle caused by thermal decomposition of $Cu(dmamb)_2$ can make it possible to form a film having a required thickness in a shorter time, which may be more advantageous for mass production of semiconductor devices.

Figure 9:
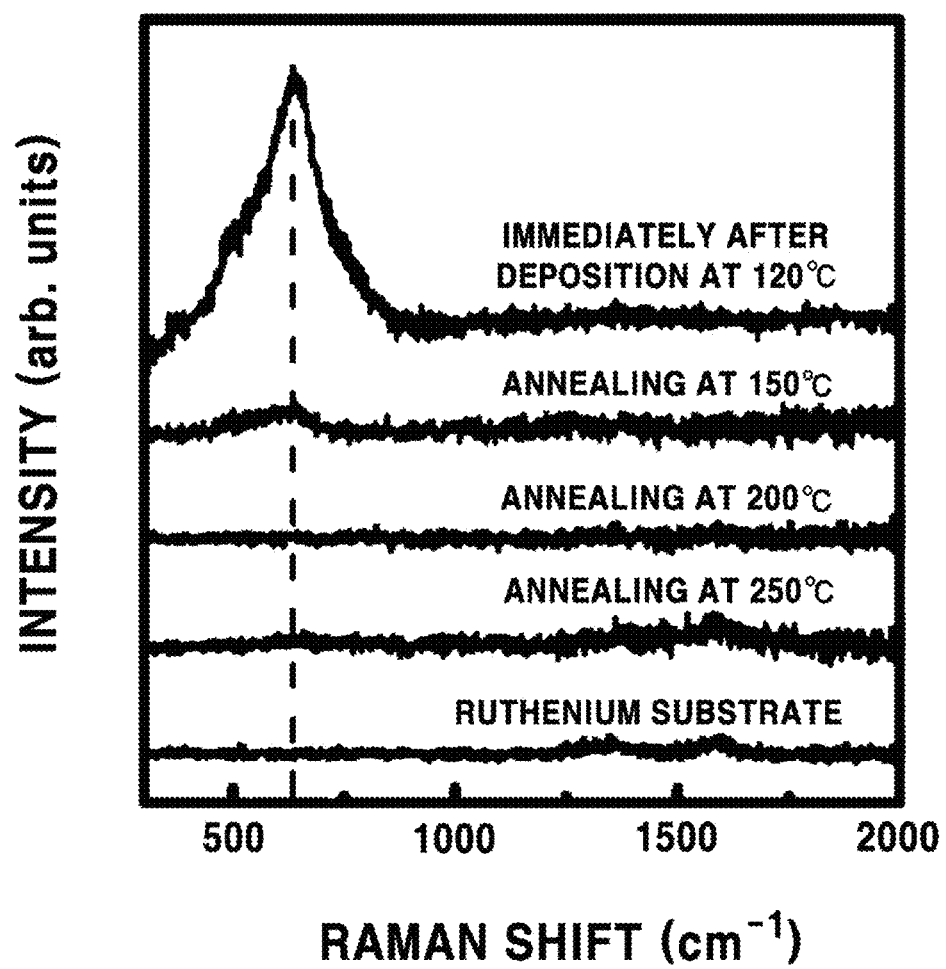
FIG. 9 shows Raman spectra of a copper nitride film prepared in accordance with an example of the present disclosure.

As shown in FIG. 9, a structure of the deposited film was analyzed by Raman spectrometry. A Raman shift of 634 $cm^{-1}$ coincided well with the reported article [A. Fallberg, M. Ottosson, J.-O. Carlsson, J. Crystal Growth 312 (2010) 1779.]. An optical band gap determined by measurement of transmission through an ALD copper nitride film deposited at 140° C. was 1.85 eV, which is included in a band gap range of from 1.1 eV to 1.9 eV reported by another group with respect to a film formed by PVD. An amount of impurities such as carbon and oxygen was less than a detection limit of an XPS (X-ray Photoelectron Spectroscopy) after sputter-etching of a surface of the ALD copper nitride film.

Then, in order to obtain a metallic copper film, a copper nitride film prepared by atomic layer deposition (ALD) was annealed at 120° C. for 50 ALD cycles in a $H_2$ atmosphere at 133 Pa for 30 minutes. As shown in FIG. 9, a Raman spectrum of the film annealed at each of different temperatures (150° C., 200° C., and 250° C.) for 30 minute was examined. A Raman shift of the copper nitride film at 634 $cm^{-1}$ was still observed when the film was annealed at 150° C., but the Raman shift completely disappeared after the film was annealed at a temperature of 200° C. or more. If annealing is performed at 150° C. in a $H_2$ atmosphere for a time longer enough than 30 minutes, the copper nitride film can be reduced to a copper metal film.

Figure 10A:
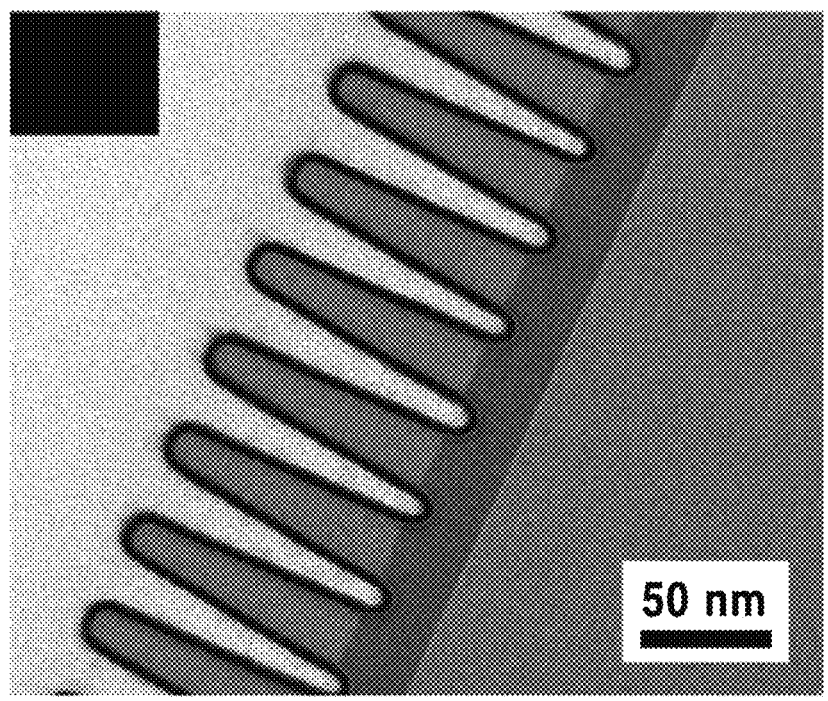
FIG. 10A and FIG. 10B are TEM images of a copper metal film prepared in accordance with an example of the present disclosure.
Figure 10B:
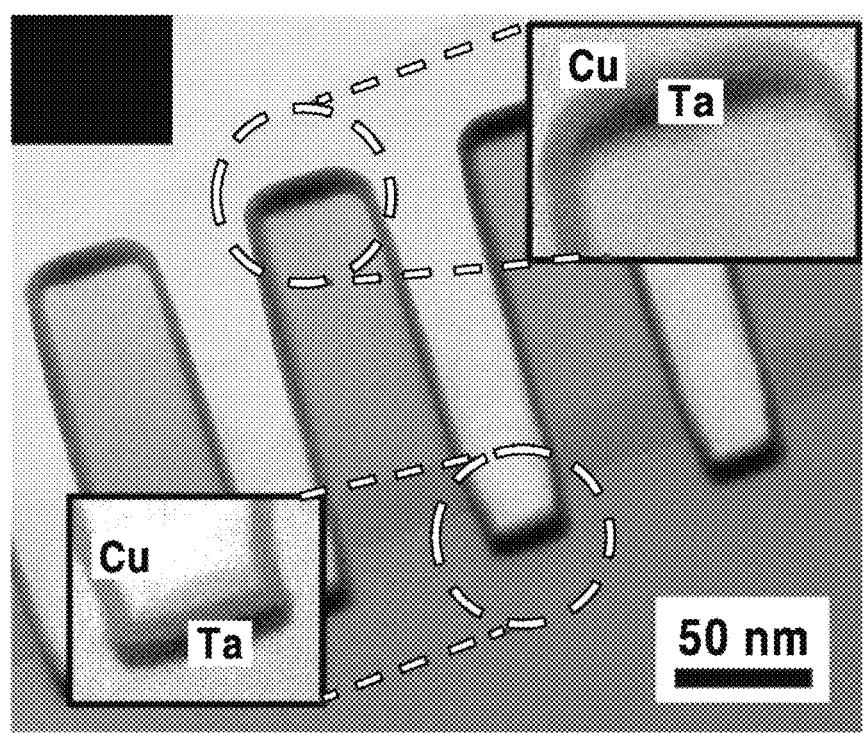

FIG. 10A and FIG. 10B are cross-sectional TEM images of a copper nitride film formed by ALD on a $SiO_2$ trench pattern (aspect ratio of about 7) and a copper metal film (seed layer) formed by reduction thereof. To be specific, FIG. 10A is an image of a copper nitride film deposited at 120° C. for 50 cycles, and FIG. 10B is an image after the deposited copper nitride film was reduced and annealed at 200° C. and shows that a Ta glue layer formed by PVD was applied prior to ALD deposition. As shown in FIG. 10A, the ALD copper nitride film has a smooth surface and excellent step coverage of 98% or more. As shown in FIG. 10B, the reduced copper metal film also has a smooth surface and perfect continuity as well as excellent step coverage with respect to the trench pattern. Further, in FIG. 10B, the Ta film formed by PVD was applied in order to improve an adhesive property of copper to $SiO_2$. If a seed layer has a smooth surface, it is advantageous for filling a groove and a hole of a very fine copper interconnect by electrodeposition. If a seed layer formed within a very narrow pattern has a rough surface, a groove and a hole may not be completely filled with copper by electrodeposition and a void may remain. A void within a copper interconnect decreases a life of a semiconductor device and adversely affects reliability.

Figure 11A:
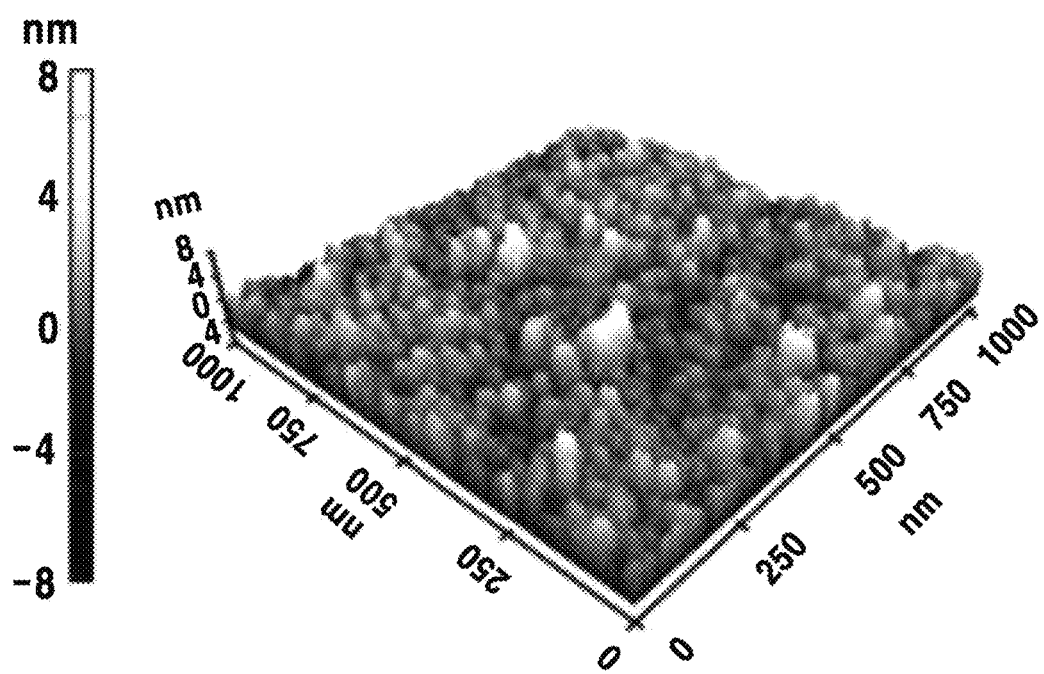
FIG. 11A to FIG. 11D are AFM images of a surface of a copper metal seed layer prepared in accordance with an example of the present disclosure and a surface of a copper metal film electrodeposited on the seed layer.
Figure 11B:
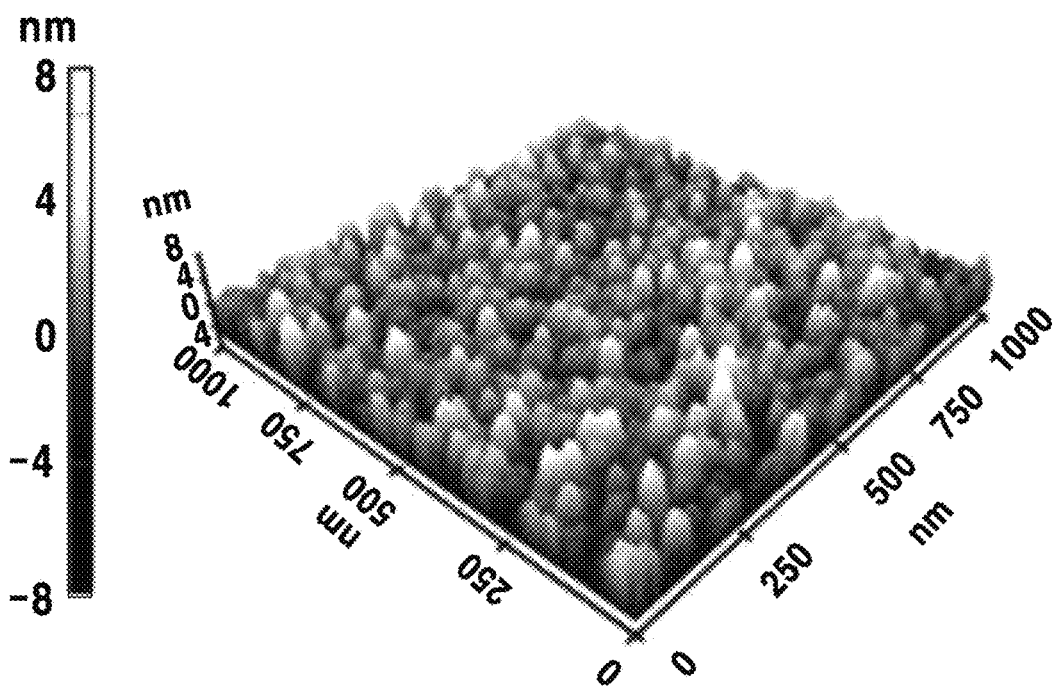
Figure 11C:
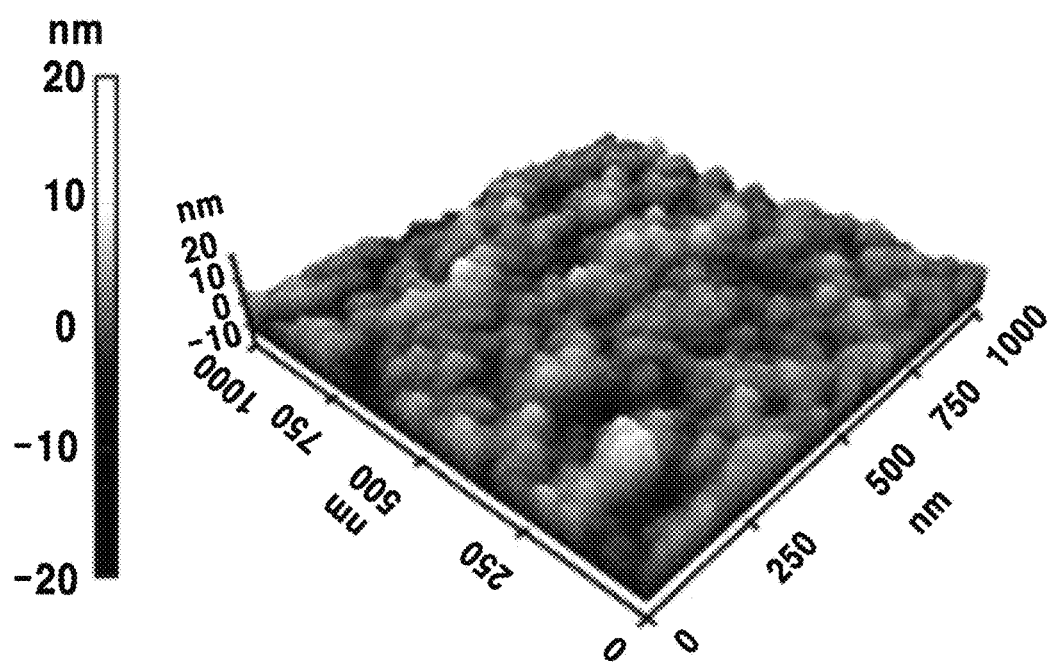
Figure 11D:
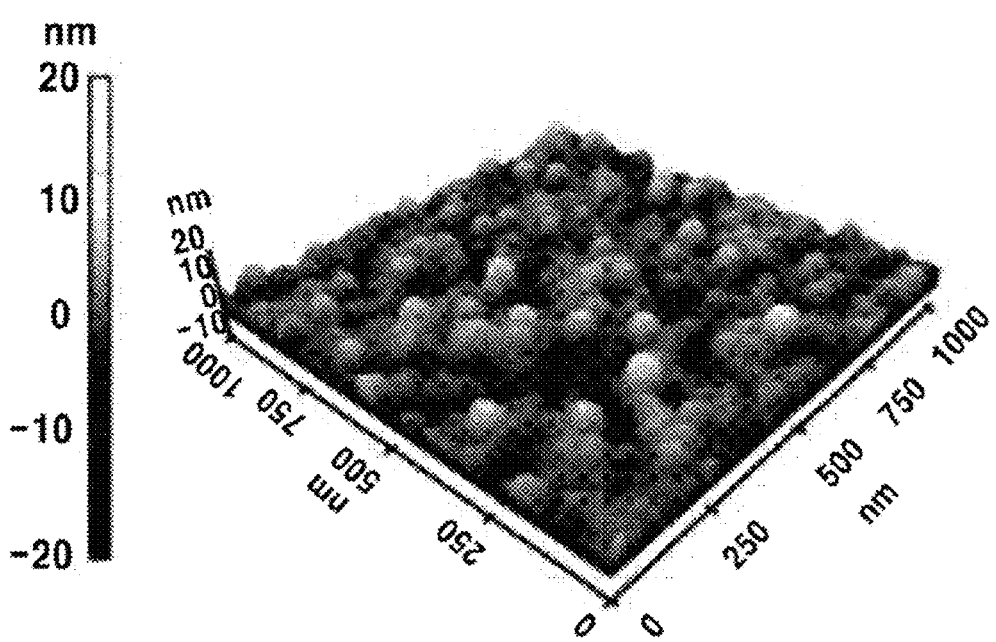

By comparison with an ALD ruthenium film seed layer, the copper metal film (I) reduced from copper nitride formed by ALD was used as a seed layer for electrodeposition to form the copper metal film (II). FIG. 11A to FIG. 11D are surface AFM images of copper metal films respectively electrodeposited on the copper metal film seed layer and a ruthenium seed layer. To be specific, FIG. 11A is a surface AFM image showing a copper metal film seed layer formed by reduction of copper nitride by ALD, FIG. 11B is a surface AFM image showing a ruthenium seed layer formed by ALD, FIG. 11C is a surface AFM image showing a copper metal film electrodeposited on the copper metal film seed layer, and FIG. 11D is a surface AFM image showing a copper metal film electrodeposited on the ruthenium seed layer. Since an amount of deposition was precisely adjusted to 100 $mC/cm^2$, a thickness of the electrodeposited copper metal film was about 63 nm in all the samples. As shown in FIG. 11C, the copper metal film electrodeposited on the copper metal film seed layer had a smoother surface than the ruthenium seed layer shown in FIG. 11D. Root-mean-square roughness values of the copper metal films electrodeposited on the copper metal film seed layer and the ruthenium seed layer were 2.2 nm and 2.7 nm, respectively. The as-plated copper metal film on the copper metal film seed layer had the resistivity of 6.3 µΩ·cm which was lower than 7.4 µΩ·cm as the resistivity of the copper metal film on the ruthenium substrate. This is assumed to be due to the smoother surface of the copper metal film, which results from a higher copper nucleation rate of the copper metal film seed layer than the ruthenium seed layer.

In the Example of the present disclosure, the copper nitride film was prepared at from 100° C. to 140° C. by a thermal ALD method using $Cu(dmamb)_2$ and $NH_3$ and then reduced to a metallic copper metal film after annealing at 200° C. or more. A growth rate of an ALD copper nitride film on both of the ruthenium and silicon oxide substrates was 0.1 nm/cycle at from 120° C. to 140° C., and a thickness of the film was reduced by about 20% after annealing. The resistivity of a copper metal film having a thickness of 4.2 nm was 30 µΩ·cm, which can be compared with that of a film formed by PVD. Both of the ALD copper nitride film and the reduced copper metal film had a very smooth surface and excellent step coverage, whereas the copper metal film deposited by alternate exposure to a copper precursor and $H_2$ had a rough surface caused by agglomeration. The copper metal film electrodeposited on the copper metal film seed layer of the Example of the present disclosure had a lower resistivity and a smoother surface than the copper metal film electrodeposited on the ALD ruthenium seed layer. As such, a continuous copper metal film seed layer, which is capable of forming a copper interconnect with an ultrafine pattern by electrodeposition and has a smooth surface, a high conductivity, and a thickness of 4.2 nm or less, can be formed by the ALD method according to the present disclosure.

The above description of the present disclosure is provided for the purpose of illustration, and it would be understood by those skilled in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner.

Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A method for preparing a copper metal film, comprising:
   supplying a copper aminoalkoxide-based precursor which is a liquid at a room temperature and a nitrogen element-containing gas alternately in an atomic layer deposition chamber to form a copper nitride film on a substrate; and
   annealing the copper nitride film for reduction thereof to form a copper metal film.

2. The method of claim 1,
   wherein the copper aminoalkoxide-based precursor which is a liquid at a room temperature includes Cu(dmamb)$_2$ to represent bis(1-dimethylamino-2-methyl-2-butoxy)copper(II).

3. The method of claim 1,
   wherein the nitrogen element-containing gas includes a gas selected from the group of NH$_3$ gas, N$_2$H$_4$ gas, N$_2$ gas, a mixture gas of N$_2$ and H$_2$, plasma-activated NH$_3$ gas, plasma-activated N$_2$H$_4$ gas, plasma-activated N$_2$ gas, a mixture gas of plasma-activated N$_2$ and H$_2$, a mixture gas of NH$_3$ gas and an inert gas, a mixture gas of N$_2$H$_4$ gas and an inert gas, a mixture gas of plasma-activated NH$_3$ gas and an inert gas, a mixture gas of plasma-activated N$_2$H$_4$ gas and an inert gas, and combinations thereof.

4. The method claim 1,
   wherein the temperature of the substrate is in a range of from 100° C. to 160° C.

5. The method of claim 1,
   wherein the annealing is performed at a temperature of 150° C. or higher in a reducing atmosphere or vacuum.

6. The method of claim 5,
   wherein the reducing atmosphere in which the annealing is performed includes hydrogen, argon, helium, or nitrogen gas.

7. The method of claim 1,
   wherein the sheet resistance of the copper metal film is 500Ω/□ or less.

8. The method of claim 1,
   wherein the thickness of the copper metal film is 10 nm or less.

9. The method of claim 1,
   wherein the thickness of the copper metal film is from 1 nm to 10 nm, and the sheet resistance of the copper metal film is from 5Ω/□ to 500Ω/□.

10. A copper metal film, prepared by the method according to claim 1.

11. The copper metal film of claim 10,
    wherein the sheet resistance of the copper metal film is 500Ω/□ or less.

12. The copper metal film of claim 10,
    wherein the thickness of the copper metal film is from 1 nm to 10 nm, and the sheet resistance of the copper metal film is from 5Ω/□ to 500Ω/□.

13. A method for forming a copper interconnect for a semiconductor device, comprising:
    electrodepositing a copper on a seed layer to form a copper metal film for interconnect, wherein the seed layer is a copper metal film prepared by the method according to claim 1.

14. The method of claim 13,
    wherein the copper metal film formed by the electrodepositing has low surface roughness and low resistivity.

15. A copper interconnect for a semiconductor device, formed by the method according to claim 13.

16. The copper interconnect for a semiconductor device of claim 15,
    wherein the copper interconnect for a semiconductor device has low surface roughness and low resistivity.

17. A semiconductor device, comprising a copper interconnect for a semiconductor device according to claim 15.

18. A composition for deposition of a copper metal film, containing the copper aminoalkoxide-based precursor which is a liquid at a room temperature.

19. The composition of claim 18,
    wherein the composition includes Cu(dmamb)$_2$ to represent bis(1-dimethylamino-2-methyl-2-butoxy)copper(II).

* * * * *